United States Patent [19]
Yatsuda et al.

[11] Patent Number: 5,523,641
[45] Date of Patent: Jun. 4, 1996

[54] SURFACE ACOUSTIC WAVE DEVICE

[75] Inventors: Hiromi Yatsuda; Yoshihiko Takeuchi, both of Mitaka, Japan

[73] Assignee: Nihon Musen Kabushiki Kaisha, Tokyo, Japan

[21] Appl. No.: 303,143

[22] Filed: Sep. 8, 1994

Related U.S. Application Data

[63] Continuation of Ser. No. 66,479, May 24, 1993, abandoned.

[30] Foreign Application Priority Data

May 27, 1992 [JP] Japan .................................. 4-135271

[51] Int. Cl.$^6$ ................................................ H01L 41/08
[52] U.S. Cl. ........................................ 310/313 R; 310/348
[58] Field of Search ............................. 310/313 R, 348; 333/195

[56] References Cited

U.S. PATENT DOCUMENTS

| | | | |
|---|---|---|---|
| 4,737,742 | 4/1988 | Takoshima et al. | 310/313 R |
| 4,864,470 | 9/1989 | Nishio | 361/400 |
| 5,205,032 | 4/1993 | Kuroda et al. | 29/740 |
| 5,252,882 | 10/1993 | Yatsuda | 310/313 R |
| 5,281,883 | 1/1994 | Ikata et al. | 310/313 R |

FOREIGN PATENT DOCUMENTS

0472856A2  3/1992  European Pat. Off. ......... H03H 9/05

OTHER PUBLICATIONS

Abstract—Country Unknown; No. 93304038.8, Author or Inventors Unknown; Untitled; No date provided.

*Primary Examiner*—Thomas M. Dougherty
*Attorney, Agent, or Firm*—Frishauf, Holtz, Goodman, Langer & Chick

[57] ABSTRACT

A surface acoustic wave device has a package and a surface acoustic wave element mounted therein face down. The package includes a side wall comprising linear inner side surfaces close to respective outer side surfaces of the surface acoustic wave element and recesses defined where the inner side surfaces of the side wall intersect at respective inner corners. When the surface acoustic wave element is inserted into the side wall along the inner side surfaces thereof, the corners of the surface acoustic wave element do not engage the side wall because of the recesses. Therefore, the outer side surfaces of the surface acoustic wave element may be positioned very closely to the inner side surfaces of the side wall. The surface acoustic wave device may be reduced in size, and the surface acoustic wave element may have input and output electrode pads and ground pads positioned highly accurately with respect to electrode pads on the bottom plate of the package.

12 Claims, 5 Drawing Sheets

SURFACE ACOUSTIC WAVE DEVICE

This application is a Continuation of application Ser. No. 08/066,479, filed May 24, 1993 now abandoned.

BACKGROUND OF THE INVENTION

1. Field of the Invention

The present invention relates to a surface acoustic wave device, and more particularly to a package having a surface acoustic wave element with electrode pads turned face down.

2. Description of the Related Art

Some surface acoustic wave elements mounted in packages are used as surface acoustic wave filters. One technical concept of a package housing a surface acoustic wave element with electrode pads turned face down is disclosed in U.S. patent application Ser. No. 07/721,823 entitled "Surface acoustic wave device and its manufacturing method" now U.S. Pat. No. 5,252,882 issued Oct. 12, 1993. In the disclosed arrangement, electrode pads of the surface acoustic wave device and electrode pads of the package are connected by gold bumps. The disclosed package is smaller in size and more expensive to manufacture than packages where electrode pads are connected by wire bonding.

The disclosed package will now be described below with reference to FIGS. 1 through 3.

As shown in FIG. 1, a package 1 with a surface acoustic wave element S mounted therein comprises a rectangular bottom plate 2, a surrounding side wall 3 mounted on a peripheral edge of the bottom plate 2, and a cover 4 mounted on the side wall 3. The side wall 3 is formed by blanking a workpiece. Wiring conductors, including electrode pads 5, are disposed on an upper surface of the bottom plate 2 by printing. The surface acoustic wave element S is mounted in the package 1 by bumps 6 on the electrode pads 5 by way of facedown bonding. The surface acoustic wave element S has electrode pads 7 on its lower surface.

To connect the electrode pads 5 on the bottom plate 2 and the electrode pads 7 of the surface acoustic wave element S, it is necessary to position the surface acoustic wave element S with respect to the package 1 very accurately. This is because poor electric connection would be achieved between the electrode pads 5 and 7 if they were relatively misaligned.

As shown in FIG. 2, the side wall 3 that is formed by blanking, has inner corners 3a, 3b, 3c, 3d which are round so as to minimize the development of microcracks therein. To be able to insert the surface acoustic wave element S into the side wall 3, the size of the surface acoustic wave element S or the size of the package 1 should be designed taking into account the round surfaces of the corners 3a, 3b, 3c, 3d of the side wall 3, so that the round corners 3a, 3b, 3c, 3d and the corners of the surface acoustic wave element S will not be damaged by contact with each other. To meet such a requirement, it is necessary to increase the gap L (see FIG. 3) between the outer side surface of the surface acoustic wave element S and the inner side surface of the side wall 3, resulting in a relatively large package size. If the gap L is relatively large, however, the surface acoustic wave element S tends to be dislocated when mounted, shifting the electrode pads 5, 7 out of alignment with each other. As a result, the desired electric conduction cannot be accomplished between the electrode pads 5 and 7.

SUMMARY OF THE INVENTION

It is therefore an object of the present invention to provide a surface acoustic wave device which is relatively small in size and achieves desired electric conduction through highly accurate positional alignment between electrode pads on a surface acoustic wave element inserted in a package and electrode pads on a bottom plate of the package.

According to the present invention, there is provided a surface acoustic wave device comprising a rectangular surface acoustic wave element, a bottom plate with wiring conductors mounted on a surface thereof, the surface acoustic wave element being joined face down to the wiring conductors, a side wall mounted on the bottom plate and having inner side surfaces positioned closely to respective linear side surfaces of the surface acoustic wave element, and a chamber including recesses adjacent to respective corners between the side surfaces of the surface acoustic wave element, the surface acoustic wave element being housed in the chamber, the side surfaces of the surface acoustic wave element being spaced from the inner side surfaces of the side wall, and a cover mounted on the side wall and closing the chamber.

Each of the recesses may be of an arcuate cross section perpendicular to an axis thereof.

Alternatively, each of the recesses may be of a substantially rectangular cross section perpendicular to an axis thereof, and have round inner corners.

The recesses are defined in respective intersections of inner side surfaces of the side wall.

When the surface acoustic wave element is inserted into the side wall along the inner side surfaces thereof, the corners of the surface acoustic wave element are prevented from engaging the side wall because of the recesses thereof. Therefore, the outer side surfaces of the surface acoustic wave element may be positioned very closely to the inner side surfaces of the side wall. The surface acoustic wave device may thus be reduced in size. With the surface acoustic wave element inserted in the side wall, electrode pads of the surface acoustic wave element are positioned highly accurately in alignment with electrode pads on the bottom plate, allowing desired electric conduction between the electrode pads.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
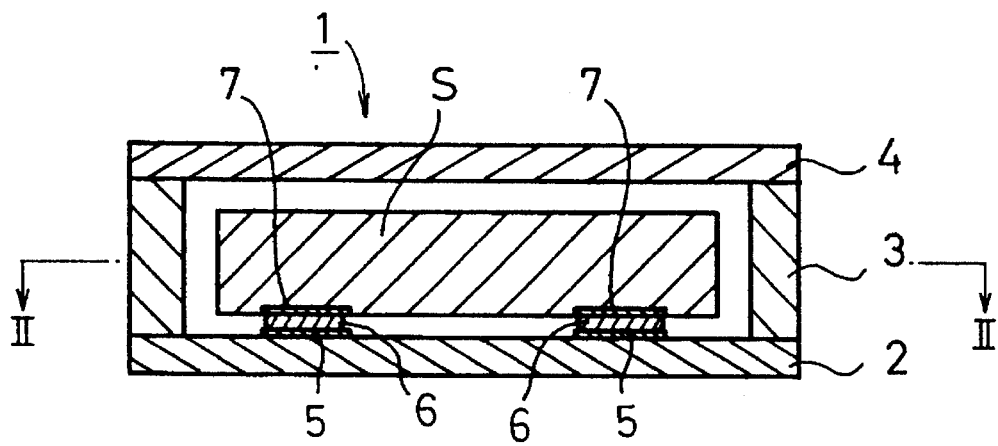
FIG. 1 is a vertical cross-sectional view of a conventional package with a surface acoustic wave element mounted therein face down.
Figure 2:
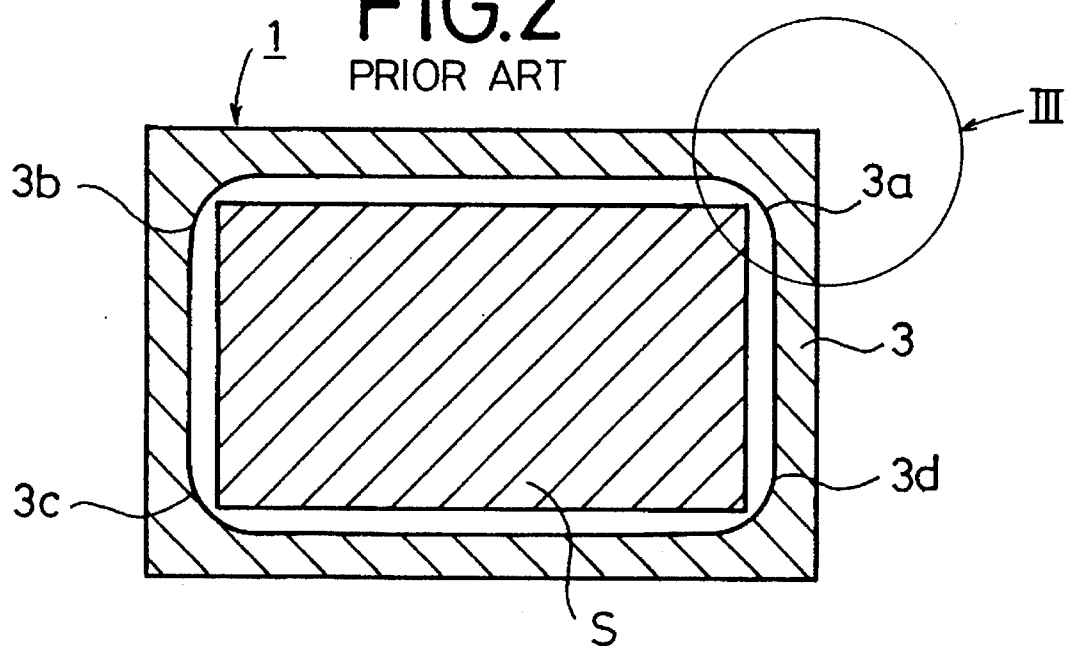
FIG. 2 is a cross-sectional view taken along line II—II of FIG. 1.
Figure 3:
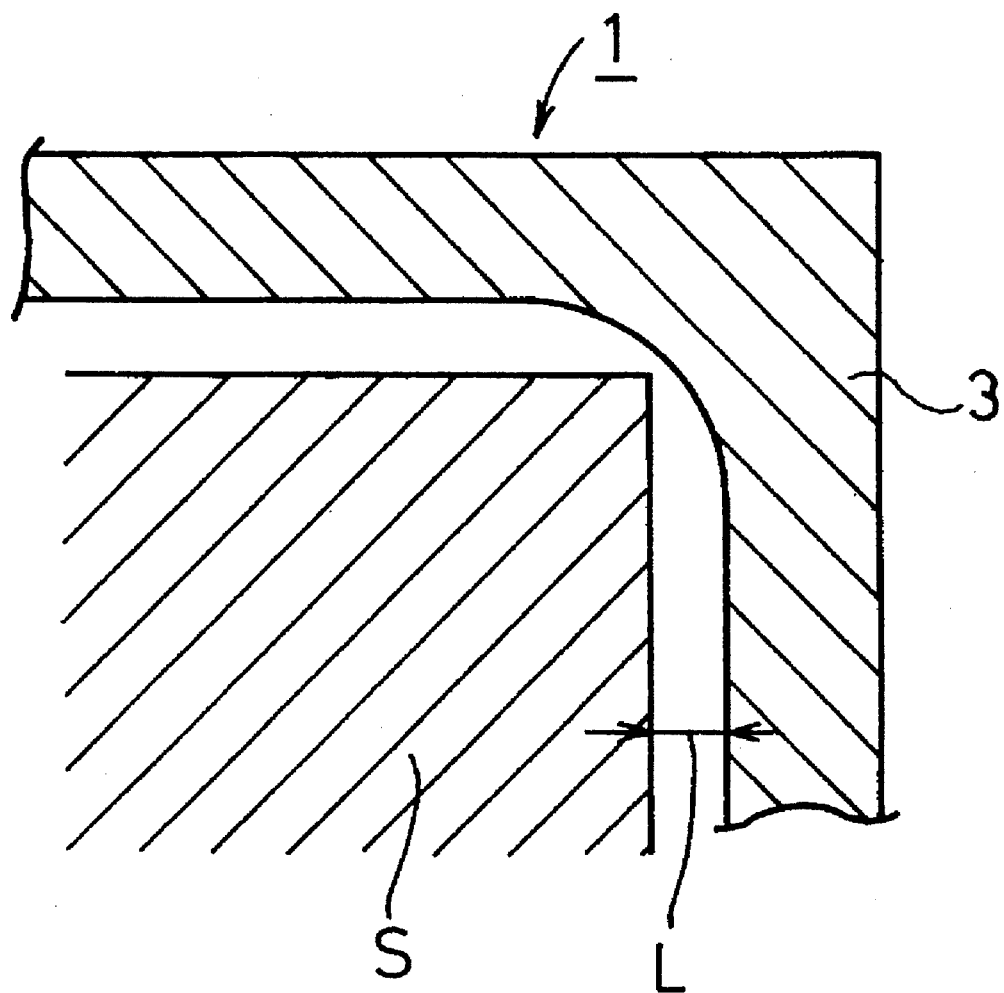
FIG. 3 is an enlarged fragmentary cross-sectional view of an encircled portion III in FIG. 2.
Figure 4:
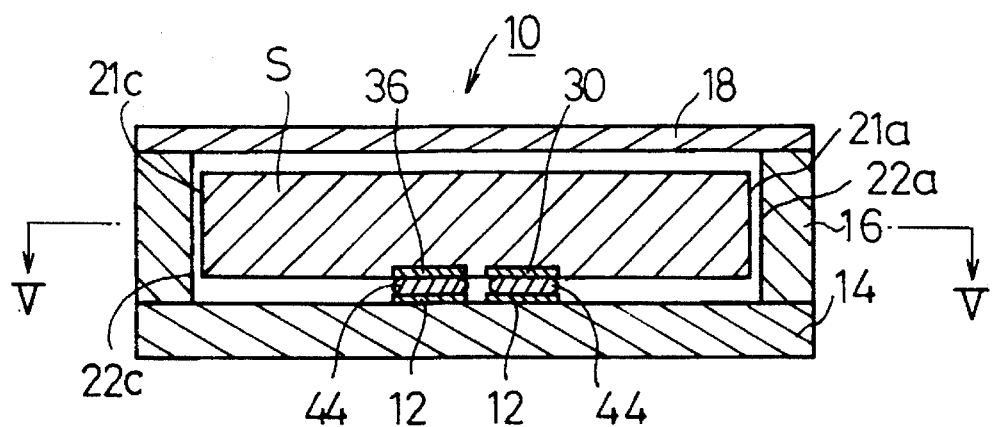
FIG. 4 is a vertical cross-sectional view of a surface acoustic wave device according to an embodiment of the present invention.
Figure 5:
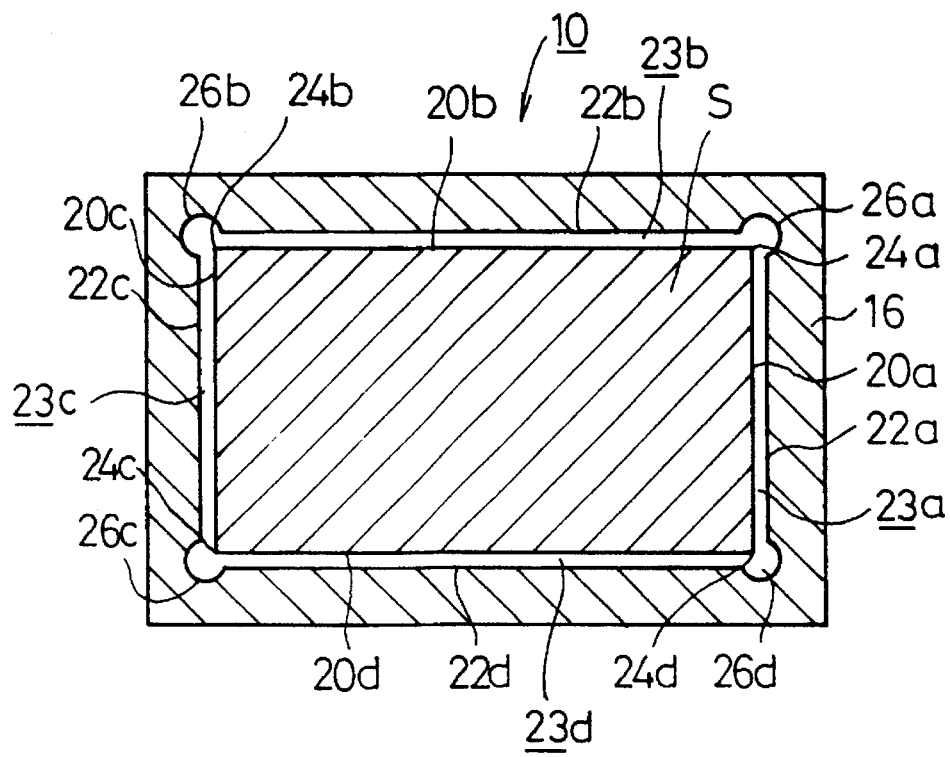
FIG. 5 is a cross-sectional view taken along line V—V of FIG. 4.

As shown in FIGS. 4 and 5, a surface acoustic wave device, which may typically be used as a surface acoustic wave filter, according to an embodiment of the present invention includes a package 10 housing an elongate rectangular surface acoustic wave element S mounted therein face down. The package 10 comprises an elongate rectangular bottom plate 14, a surrounding side wall 16 mounted on a peripheral edge of the bottom plate 14, and a cover 18 mounted on the side wall 16 and closing the opening or chamber of the side wall 16. The bottom plate 14 has wiring conductors and electrode pads 12 disposed on its upper surface by screen printing.

The side wall 16 comprises four linear inner wall surfaces 22a, 22b, 22c, 22d, closely facing respective linear outer side surfaces 20a, 20b, 20c, 20d of the surface acoustic wave element S, and four recesses 26a, 26b, 26c, 26d defined where the inner wall surfaces 22a, 22b, 22c, 22d intersect at respective inner corners of the side wall 16. A chamber is formed thereby. The recesses 26a, 26b, 26c, 26d are part of the chamber and positioned immediately adjacent to the respective four outer corners of the surface acoustic wave element S. The side wall 16 is sintered integrally with the bottom plate 14 which is placed as a green sheet in a heating furnace. As shown in FIG. 5, the recesses 26a, 26b, 26c, 26d comprise spaces of substantially circular or arcuate cross section perpendicular to their axes, which spaces communicate with gaps 23a, 23b, 23c, 23d that are defined between the outer side surfaces 20a, 20b, 20c, 20d of the surface acoustic wave element S and the inner wall surfaces 22a, 22b, 22c, 22d of the side wall 16.

Figure 6:
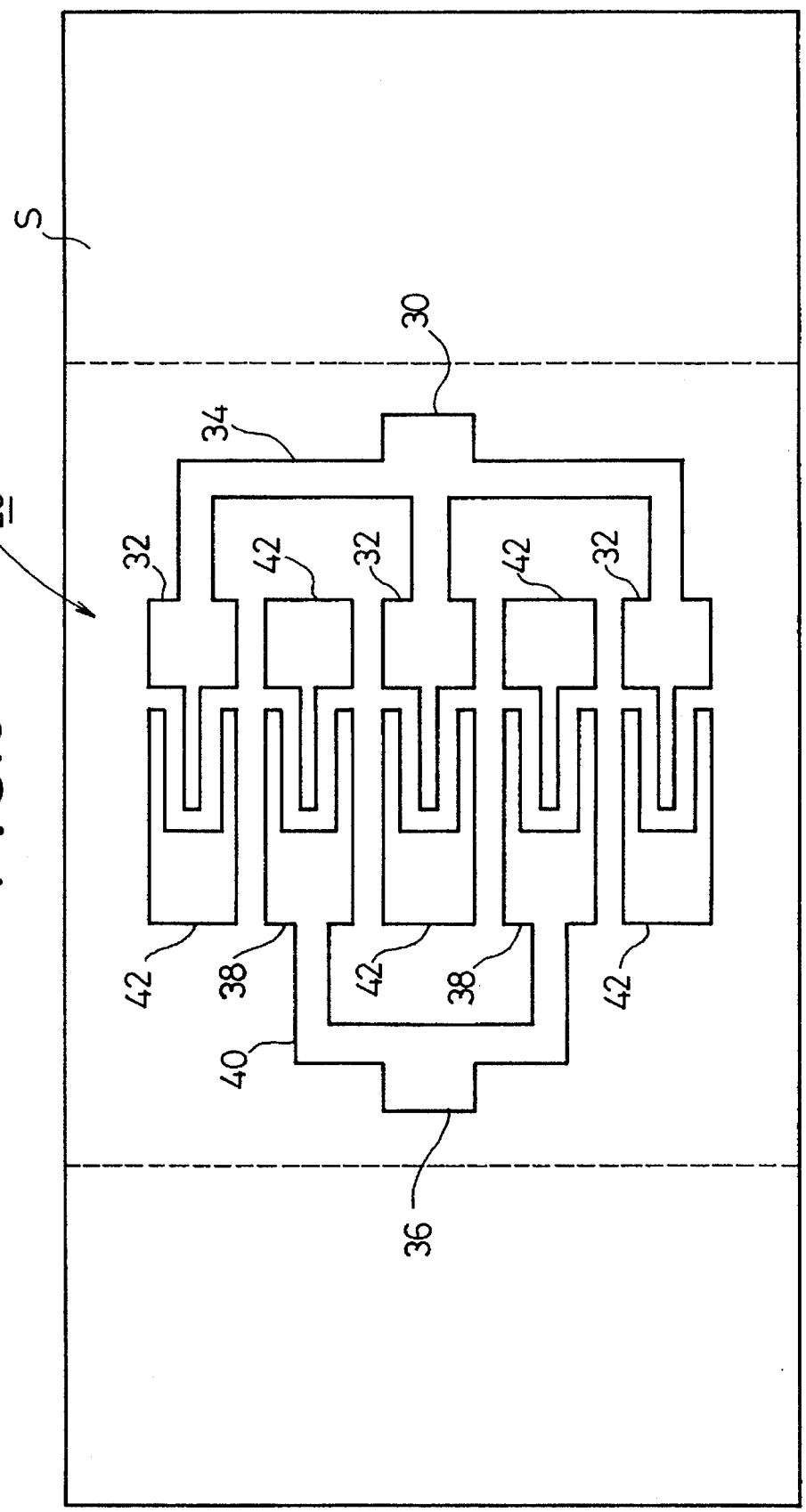
FIG. 6 is a plan view of wiring conductors of a surface acoustic wave element of the surface acoustic wave device shown in FIG. 4.

FIG. 6 shows a pattern 28 of wiring conductors of the surface acoustic wave element S. The pattern 28 comprises an input electrode pad 30, input electrodes 32, a bus bar 34 interconnecting the input electrodes 32, an output electrode pad 36, output electrodes 38, a bus bar 40 interconnecting the output electrodes 38, and ground pads 42. The input electrodes 32, the output electrodes 38, and the ground pads 42 have fingers arranged in an interdigital configuration.

A procedure of mounting the surface acoustic wave element S in the package 10 will be described below with reference to FIGS. 4 and 5.

The surface acoustic wave element S with gold bumps 44 attached respectively to the input electrode pad 30, the output electrode pad 36, and the ground pads 42 is inserted into the chamber of the side wall 16 along the inner side surfaces 22a, 22b, 22c, 22d of the side wall 16. Then, the bottom plate 14, the side wall 16, and the surface acoustic wave element S are heated and pressed to melt the gold bumps 44 to thereby bond the input electrode pad 30, the output electrode pad 36, and the ground pads 42 to the electrode pads 12 on the bottom plate 14. Thereafter, the cover 18 is bonded to the side wall 16. Since the side wall 16 has no round inner corners, the surface acoustic wave element S may be inserted into the side wall 16 closely to the inner side surfaces 22a, 22b, 22c, 22d thereof.

More specifically, since the recesses 26a, 26b, 26c, 26d defined in the respective inner corners of the side wall 16 are sufficiently spaced from the respective corners 24a, 24b, 24c, 24d of the surface acoustic wave element S, the inner side surfaces 22a, 22b, 22c, 22d of the side wall 16 may be positioned sufficiently closely to the outer side surfaces 20a, 20b, 20c, 20d of the surface acoustic wave element S. Stated otherwise, if the surface acoustic wave element S is of a size slightly smaller than the chamber defined by the inner side surfaces 22a, 22b, 22c, 22d of the side wall 16, then the surface acoustic wave element S can be positioned in place in the package 10 simply by inserting the surface acoustic wave element S into the side wall 16 and spacing the surface acoustic wave element S from the inner side surfaces 22a, 22b, 22c, 22d of the side wall 16. In the inserted position, the input electrode pad 30 and the output electrode pad 36 of the surface acoustic wave element S are disposed in confronting relationship to the electrode pads 12 on the bottom plate 14. After the surface acoustic wave element S has been inserted, the input electrode pad 30, the output electrode pad 36, and the ground pads 42 of the surface acoustic wave element S are joined to the electrode pads 12 on the bottom plate 14 by the gold bumps 44 with heat and pressure. Because of the recesses 26a, 26b, 26c, 26d, the corners 24a, 24b, 24c, 24d of the surface acoustic wave element S are prevented from hitting the side wall 16 and hence from being damaged thereby.

A surface acoustic wave device according to another embodiment of the present invention will be described below with reference to FIGS. 7 and 8. Those parts of the surface acoustic wave device shown in FIGS. 7 and 8 which are identical to those of the surface acoustic wave device shown in FIGS. 4 through 6 are denoted by identical reference numerals.

Figure 7:
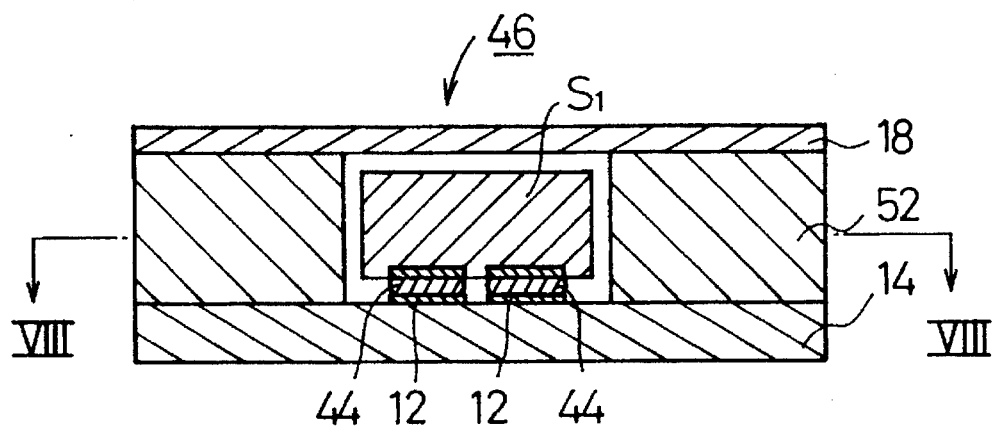
FIG. 7 is a vertical cross-sectional view of a surface acoustic wave device according to another embodiment of the present invention.
Figure 8:
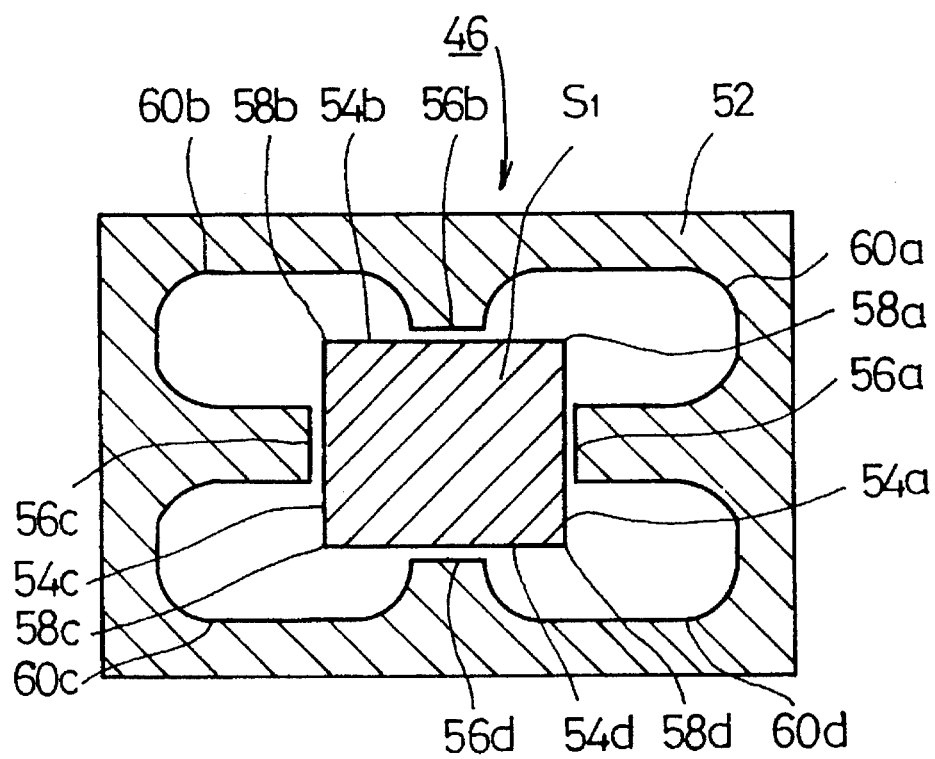
FIG. 8 is a cross-sectional view taken along line VIII—VIII of FIG. 7.

The surface acoustic wave device shown in FIGS. 7 and 8 includes a square surface acoustic wave element S1 having a higher oscillation frequency than the surface acoustic wave element S shown in FIGS. 4 through 6. Therefore, surface acoustic wave element S1 may be smaller in size than the surface acoustic wave element S.

As shown in FIGS. 7 and 8, the surface acoustic wave device has a package 46 with the surface acoustic wave element S1 mounted therein face down. The package 46 comprises a rectangular bottom plate 14, a surrounding side wall 52 mounted on a peripheral edge of the bottom plate 14, and a cover 18 mounted on the side wall 52 and closing the opening of the side wall 52. The bottom plate 14 has wiring conductors and electrode pads 12 disposed on its upper surface by screen printing.

The side wall 52 comprises four linear inner wall surfaces 56a, 56b, 56c, 56d closely facing respective linear outer side surfaces 54a, 54b, 54c, 54d of the surface acoustic wave element S1, and four relatively large elongate recesses 60a, 60b, 60c, 60d defined where the inner wall surfaces 56a, 56b, 56c, 56d intersect at respective inner corners of the side wall 52, the recesses 60a, 60b, 60c, 60d being positioned immediately adjacent to the respective four outer corners of the surface acoustic wave element S1 and each having round inner corners. Each of the recesses 60a, 60b, 60c, 60d is of a substantially rectangular cross section perpendicular to the axis thereof. If the distance between the input and output electrode pads 30, 36 of the surface acoustic wave element S1 is the same as that of the surface acoustic wave element S shown in FIG. 6, then it is possible to mount the surface acoustic wave element S1 in the side wall 52 shaped as shown in FIG. 8 using the same bottom plate 14 and cover 18 as those shown in FIG. 4.

Stated otherwise, surface acoustic wave elements of different sizes, which include the surface acoustic wave elements S or S1, may be positioned, without damage and for desired electric conduction between electrode pads, in respective packages having corresponding side walls of different shapes, which include the side walls 16 or 52.

The surface acoustic wave device according to the present invention may be reduced in size and have increased positioning accuracy between the electrode pads of the surface acoustic wave element and the electrode pads on the bottom plate of the package. The surface acoustic wave device, used as a surface acoustic wave filter, thus provides stable performance.

Insofar as the distance between the electrode pads remains the same, surface acoustic wave elements of different sizes can easily be positioned in respective packages simply by customizing side walls thereof for the differently sized surface acoustic wave elements. Accordingly, the surface acoustic wave elements are not increased in size, and the number of surface acoustic wave elements that can be fabricated from a single wafer can be increased. As a result, surface acoustic wave devices as surface acoustic wave filters can be manufactured inexpensively.

Although certain preferred embodiments of the present invention have been shown and described in detail, it should be understood that various changes and modifications may be made therein without departing from the scope of the appended claims.

What is claimed is:

1. A combined surface acoustic wave device and package system, comprising:

a rectangular surface acoustic wave element having a given size, and having linear side surfaces and corners at respective intersections of adjacent linear side surfaces;

a bottom plate of given size and with wiring conductors mounted on a surface thereof, said surface acoustic wave element being mounted on said bottom plate face down and connected to said wiring conductors;

a plurality of rectangular-shaped intermediate members, each having a peripheral wall mounted on a peripheral edge of said bottom plate, said peripheral wall having four sides and a substantially uniform thickness, and wherein said substantially uniform thickness is constant around the entirety of said peripheral wall;

each of said intermediate members having four projecting members projecting inwardly from respective sides of said peripheral wall, said projecting members of said intermediate members having respective projecting lengths corresponding to a given size surface acoustic wave element, at least some of said intermediate members having said projecting members of different length than others of said intermediate members, and said projecting members of a given one of said intermediate members defining inner side surfaces positioned closely to respective linear side surfaces of a given size surface acoustic wave element, said projecting members further defining four recesses disposed at respective corners of said peripheral wall between said projecting members, said surface acoustic wave element being disposed on said bottom plate such that said respective linear side surfaces of said given size surface acoustic wave element are disposed immediately adjacent to and in close proximity to said inner side surfaces defined by said projecting members, and wherein respective corners of said given size surface acoustic wave element project respectively into said four recesses; and a cover of given size and having a same peripheral shape and size as said bottom plate, said cover being mounted on said peripheral wall of said intermediate member and closing a chamber defined by said bottom plate, said intermediate member and said cover, wherein said package comprises said cover, a selected one of said plurality of intermediate members and said bottom plate, and wherein different size surface acoustic wave elements are housed in said package using said given size bottom plate and cover and a selected one of said plurality of intermediate members having projecting members which correspond in size to said respective different size surface acoustic wave element.

2. A combined surface acoustic wave device and package system according to claim 1, wherein each of said recesses has a substantially rectangular cross section perpendicular to an axis thereof.

3. A combined surface acoustic wave device and package system according to claim 2, wherein each of said recesses has rounded inner corners.

4. A combined surface acoustic wave device and package system according to claim 1, wherein said recesses are defined in respective intersections of inner side surfaces of said peripheral wall.

5. A combined surface acoustic wave device and package system according to claim 1, wherein said inner side surfaces defined by said projecting members are substantially flat.

6. A combined surface acoustic wave device and package system according to claim 1, wherein said projecting members are arranged at positions intermediate respective corners of said peripheral wall.

7. A combined surface acoustic wave device and package system according to claim 1, wherein said four projecting members each have a respective width in the direction of the length of the respective side of said peripheral wall from which they project, said width being substantially smaller than the length of said respective side of said peripheral wall.

8. A combined surface acoustic wave device and package system, comprising:

a bottom plate of given size, said bottom plate having electrode pads mounted on a top surface thereof;

a rectangular surface acoustic wave element having a given size, said surface acoustic wave element being mounted on said bottom plate face down and being connected to said electrode pads, and said surface acoustic wave element having linear side surfaces and corners at respective intersections of adjacent linear side surfaces;

a plurality of rectangular-shaped intermediate peripheral wall members, each intermediate member having a peripheral wall mounted on a peripheral edge of said bottom plate in surrounding relationship to said surface acoustic wave element, said peripheral wall of each intermediate member having four sides and a substantially uniform thickness, and wherein said substantially uniform thickness is constant around the entirety of said peripheral wall;

each of said intermediate members having four projecting members projecting inwardly from respective sides of said peripheral wall, said projecting members of said intermediate members having respective projecting lengths corresponding to a given size surface acoustic wave element, at least some of said intermediate members having said projecting members of different length than others of said intermediate members, and said projecting members of a given one of said intermediate members defining inner side surfaces positioned closely to said linear side surfaces of a given size surface acoustic wave element, said projecting members further defining four recesses disposed at respective corners of said peripheral wall between said projecting members, said surface acoustic wave element being disposed on said bottom plate such that said respective linear side surfaces of said given size surface acoustic wave element are disposed immediately adjacent to and in close proximity to said inner side surfaces defined by said projecting members, and wherein respective corners of said given size surface acoustic wave element project respectively into said four recesses;

wherein said package comprises at least said given size bottom plate and a selected one of said plurality of intermediate peripheral wall members, with said given size surface acoustic wave element accommodated in a space within said package, and wherein different size surface acoustic wave elements are mountable on a standard size bottom plate of said package used with a selected one of said plurality of intermediate peripheral wall members having projecting members which correspond in size to said respective different size surface acoustic wave element.

9. A combined surface acoustic wave device and package system according to claim 8, wherein said inner side surface defined by said projecting members are substantially flat.

10. A combined surface acoustic wave device and package system according to claim 8, wherein said projecting members are arranged at positions intermediate respective corners of said peripheral wall.

11. A combined surface acoustic wave device and package system according to claim 8, wherein said four projecting members each have a respective width in the direction of the length of the respective side of said peripheral wall from which they project, said width being substantially smaller than the length of said respective side of said peripheral wall.

12. A combined surface acoustic wave device and package system according to claim 8, further comprising a standard size cover which is of a size to cover all of said plurality of intermediate peripheral wall members, and which is mounted on said peripheral wall of said selected one of said intermediate peripheral wall members.

* * * * *